United States Patent [19]

Davies et al.

[11] 4,017,887
[45] Apr. 12, 1977

[54] METHOD AND MEANS FOR PASSIVATION AND ISOLATION IN SEMICONDUCTOR DEVICES

[75] Inventors: D. Eirug Davies, Belmont; Sven A. Roosild, Billerica; Russell P. Dolan, Jr., Concord, all of Mass.

[73] Assignee: The United States of America as represented by the Secretary of the Air Force, Washington, D.C.

[22] Filed: Dec. 20, 1974

[21] Appl. No.: 535,062

Related U.S. Application Data

[63] Continuation-in-part of Ser. No. 275,018, July 25, 1972, abandoned.

[52] U.S. Cl. .................................. 357/52; 357/50; 357/61; 357/91; 357/63
[51] Int. Cl.² ................ H01L 29/34; H01L 27/04; H01L 29/161; H01L 29/167
[58] Field of Search ................ 357/91, 52, 50, 61, 357/63

[56] References Cited

UNITED STATES PATENTS

| 3,390,019 | 6/1968  | Manchester | 357/91 |
| 3,515,956 | 6/1970  | Martin et al. | 357/91 |
| 3,586,542 | 6/1971  | MacRae | 357/91 |
| 3,622,382 | 11/1971 | Brack | 357/91 |
| 3,653,978 | 4/1972  | Robinson | 357/91 |
| 3,666,548 | 5/1972  | Brack | 357/91 |

*Primary Examiner*—Edward J. Wojciechowicz
*Attorney, Agent, or Firm*—Joseph E. Rusz; Henry S. Miller

[57] ABSTRACT

The use of ion implantation to produce low concentrations of chromium, oxygen or iron in a gallium arsenide junction type semiconductor, utilizing the accompanying low resistivity to provide an improved device.

5 Claims, 3 Drawing Figures

METHOD AND MEANS FOR PASSIVATION AND ISOLATION IN SEMICONDUCTOR DEVICES

STATEMENT OF GOVERNMENT INTEREST

The invention described herein may be manufactured and used by or for the Government for governmental purposes without the payment of any royalty thereon.

CROSS REFERENCE TO RELATED APPLICATION

The present patent application is a continuation-in-part of U.S. patent application Ser. No. 275,018 filed July 25, 1972 entitled METHOD AND MEANS FOR PASSIVATION AND ISOLATION IN SEMICONDUCTOR DEVICES by Eriug D. Davies et al, now abandoned.

BACKGROUND OF THE INVENTION

This invention relates generally to semiconductor devices and more particularly to a method and means for forming discreet semi-insulating regions in solid state devices.

Semiconductor devices containing p-n junctions have shown less than satisfactory properties when exposed to intense bursts of radiation in the gamma ray range. Instruments used in monitoring such radiation becomes erratic and sometimes malfunction as a result of transient radiation. One solution to this difficulty is the utilization of sufficient high density shielding to protect vital parts of the instrument, however, space and weight considerations often require an alternative solution. We have discovered that it is possible to reduce and eliminate the effects of high intensity transient radiation in semiconductor devices by decreasing the number of photo induced carriers in the active region near a p-n junction in some materials, thereby allowing for a faster recovery time as well as eliminating the radiation effects completely in some instances.

In addition to the transient radiation effects, semiconductors are limited in higher frequency applications because of excessive output capacitance. If the number of induced carriers are controlled in the active regions as indicated, higher frequencies than hitherto experienced are attainable.

Investigations reveal that gallium arsenide while a suitable compound, is difficult to work with and control during ordinary and well known diffusion processes. This invention as described hereinafter, solves these problems of the prior art.

SUMMARY OF THE INVENTION

The invention advances the state of the art in a manner that now allows semiconductive apparatus to be constructed that resist and rapidly recover from the effects of transient radiation and similarly increase the frequency capability of such devices.

The process described in the instant invention relates to the characteristics of passivation and isolation in semiconductor materials and in particular gallium arsenide.

Passivation is accomplished by implanting the compensating impurities, chromium, oxygen or iron to form a semi-insulating material. A semi-insulating material is defined as having a resistivity of between $10^6$ and $10^9$ ohm centimeters whereas a semiconducting material would have a resistivity of between 0.01 and 100 ohm centimeters. The implantation distribution is confined to a thin layer extending to the surface of the material for passivation. Part of the crystal now becomes the protective layer and effectually, the surface of the semiconductor is lowered below the physical surface of the material.

In the case of isolation, the energy of implantation is increased to cause the effected area to form a buried semi-insulating layer below the surface while the semi-conducting layer remains unaffected above it and when acted upon with appropriate edge implantations, becomes isolated from the bulk of the semiconductor.

The invention uses low concentrations of impurity ions thereby not altering the chemical makeup of the compound. We have found that the process is not valid for silicon and compounds thereof. An outstanding advantage of the invention eminates from the fact that the low concentration of anti dopants increases the speed and accuracy with which these semiconductors may be manufactured as well as lowering the costs involved.

Previously, work with galium arsenide showed that it was difficult to control the overall physical demensions of the compound. The concept of accurate control of thin regions and accompanying resistivity of these regions was considered to be impossible with current state of the art.

We have found that it is possible to achieve the desired results by the use of selected ion implantation combined with the avoidance of lattice destruction or the forming of new compounds.

It is therefore an object of the invention to provide new and improved solid state devices.

It is another object of the invention to provide new and improved semiconductor devices.

It is a further object of the invention to provide a new and improved semiconductor device that is resistant to the effects of transient pulses of gamma radiation.

It is still another object of the invention to provide a semiconductor device that may be manufactured with a high degree of reliability.

It is still a further object of the invention to provide a process for manufacturing semiconductor devices which is more accurate and reliable than any similar process hitherto known.

It is another object of the invention to provide a new and improved method of making semi-insulating devices.

It is another object of the invention to provide a new and improved method of forming semi-insulating layers in solid state devices.

It is another object of the invention to provide a gallium arsenide semiconductor device with a region of low resistivity semi-insulating material.

It is another object of the invention to provide a gallium arsenide semiconductor device with a region of low resistivity semi-insulating material that does not form or require that a new compound be formed.

These and other advantages, features and objects of the invention will become more apparent from the following description taken in connection with the illustrative embodiment in the accompanying drawing.

DESCRIPTION OF THE PREFERRED EMBODIMENT

Figure 1:
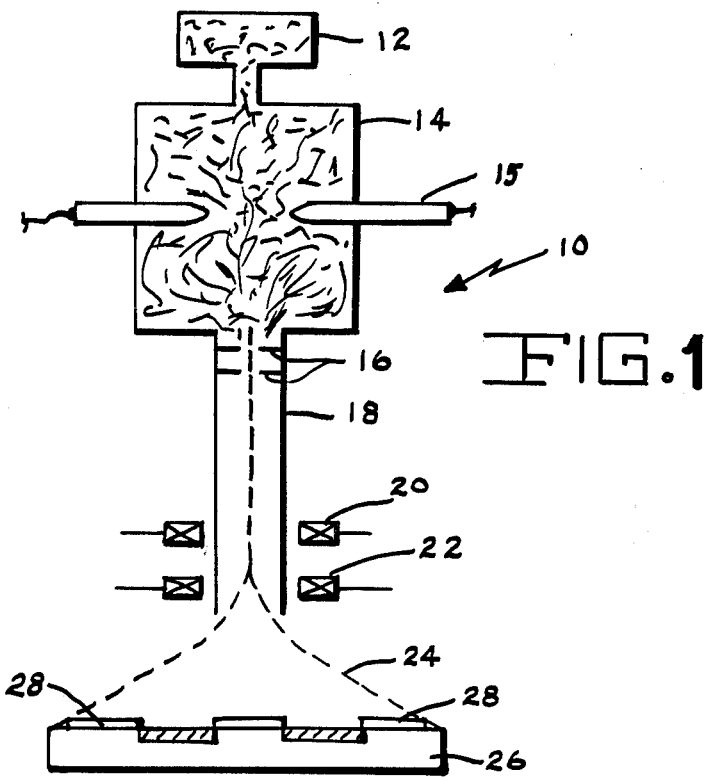
FIG. 1 is a diagrammatic representation of the invention.

Referring now to FIG. 1, an ion accelerating device is shown generally at 10. A gas of the character to be implanted, such as oxygen, is stored in the container 12 and fed into the chamber 14. Electrodes 15 create an arc thereby forming oxygen ions. The ions are drawn through the collimating slits 16 and accelerated through the tube to a preselected energy level. The magnets 20 and 22 focus the beam and cause it to sweep 24 the semiconductor 25. The semiconductor may be covered with an appropriate mask 28 to cause the ions to be implanted in the desired pattern. The energy of the ions will determine the depth of their implantation into gallium arsenide.

Figure 2:
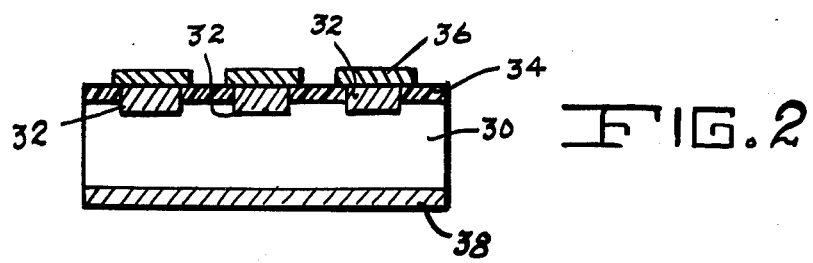
FIG. 2 is a cross sectional view of a semiconductor device with a semi-insulating surface layer.

An example of one embodiment of the invention is shown in FIG. 2 where a surface semi-insulating layer is used to passivate an array of p-n junctions.

Beginning initially with a polished wafer of N-type gallium arsenide 30, p-type islands 32 are formed by such conventional means as thermal diffusion or alternatively ion implantation of p-type dopant ions. Photolithographic marking techniques may be utilized to define the surface geometry of the diode.

Subsequent to the formation of the diode, the area defining mask may be retained or removed and the wafer mounted in an ion accelerator as shown in FIG. 1. Compensating ions are implanted at an energy or energies to give the desired depth distribution. The implanted dope 34 is chosen to compensate a n-type gallium arsinide but not the heavier doped p-type.

By relying on the specific non-neutral properties of ions of chromium, oxygen or iron the desired effect is produced when implanted at a concentration of $10^{14}$ to $10^{18}$ ions per cubic centimeter. This concentration provides sufficient ions to capture excessive free carriers. However, insufficient ions to form a new compound (where ion concentrations in the order of $10^{20}$ to $10^{27}$ are required) are provided.

Thus, only the surface layer between the p-type regions becomes semi-insulating. Customarily, thermal annealing is necessary to optimise the properties of the semi-insulating layer.

Metallic contacting layers 36, 38 are deposited on both surfaces of the wafer. Likewise, photolithographic techniques may be used to define the specific contact areas. It should be noted that with the presence of a semi-insulating layer, contacts on the surface containing the junction are able to be larger in area than the diodes themselves.

Figure 3:
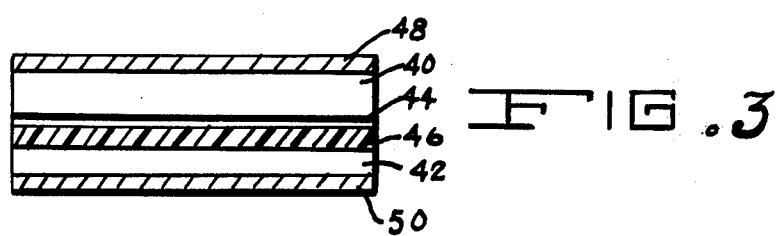
FIG. 3 is a cross sectional view of a semiconductor device with a buried semi-insulating layer.

FIG. 3 shows the isolation aspect of the invention. Where two materials 40 and 42 are brought together to form a p-n junction 44, a buried layer of compensating ions 46 isolates the junction from the semiconducting material below it. Contacts 48 and 50 are deposited on the wafer after the layer 46 has been implanted in the manner shown in FIG. 1.

Obviously, many modifications and variations of the present invention are possible in the light of the above teachings. It is therefore to be understood that within the scope of the apended claims, the invention may be practiced otherwise than as specifically described.

What is claimed is:

1. A radiation resistant semiconductor device comprising: a wafer of n-type gallium arsenide semiconductor material; islands of p-type material located in the wafer and forming a portion of the surface thereof, said p and n material so positioned as to form p-n junctions; implanted regions of compensating chromium ions having a concentration between $10^{14}$ to $10^{18}$ ions per cubic centimeter, said ions being of insufficient concentration to form a new compound, but of sufficient concentration to form a semi-insulating layer of carrier depleted gallium arsenide, having a resistivity of between $10^6$ and $10^9$ ohm centimeters, extending to the surface of the wafer and surrounding said islands of p material; and contact means affixed to the n and p material for attaching electrical conductors.

2. A radiation resistant semiconductor device according to claim 1 wherein said regions of compensating ions comprise, iron ions in a concentration between $10^{14}$ to $10^{18}$ ions per cubic centimeter.

3. A radiation resistant semiconductor device comprising; a wafer of gallium arsenide semiconductor material, having a first layer containing n type dopants and a second layer containing p type dopants and together said portions forming a p-n junction; a region of compensating chromium ions having a concentration between $10^{14}$ to $10^{18}$ ions per cubic centimeter implanted in said n type portion, said ions being of insufficient concentration to form a new compound, but of sufficient concentration to form a semi-insulating layer of carrier depleted gallium arsenide having a resistivity of between $10^6$ and $10^{19}$ ohm-centimeters, parallel and in close spaced relation to the p-n junction, and contact means affixed to the first and second portions for affixing electrical conductors thereto.

4. A radiation resistant semiconductor device according to claim 3 wherein said regions of compensating ions comprise, iron ions in a concentration between $10^{14}$ to $10^{18}$ ions per cubic centimeter.

5. A method of forming radiation resistant gallium arsenide semiconductor devices comprising the steps of: forming areas of p type material on an n doped semiconductor wafer; covering the p type areas with an ion impervious mask; placing the wafer in an ion accelerating means; implanting compensating chromium ions in the n type wafer having a concentration between $10^{14}$ and $10^{18}$ ions per cubic centimeter, whereby said implanted ions form a layer surrounding said areas of p type material having ions of insufficient concentration to form a new compound, but of sufficient concentration to form a semi-insulating layer having a resistivity of between $10^6$ and $10^9$ ohm-centimeters, causing a reduced number of photo induced ions to be generated by intense radiation; removing the mask, and affixing electrical contacts.

* * * * *